United States Patent [19]
Okamura et al.

[11] Patent Number: 5,566,117
[45] Date of Patent: Oct. 15, 1996

[54] RELIABLE SELF-REFRESHING OPERATION IN A DRAM TYPE OF SEMICONDUCTOR MEMORY DEVICE

[75] Inventors: Yoshifumi Okamura; Shinji Sakuragi, both of Tokyo, Japan

[73] Assignee: NEC Corporation, Tokyo, Japan

[21] Appl. No.: 532,884

[22] Filed: Sep. 22, 1995

[30] Foreign Application Priority Data

Sep. 22, 1994 [JP] Japan .................................. 6-227812

[51] Int. Cl.$^6$ ................................. G11C 7/00
[52] U.S. Cl. ............................. 365/222; 365/201
[58] Field of Search ........................... 365/222, 189.02, 365/193, 201; 371/21.1, 21.2, 21.3

[56] References Cited

U.S. PATENT DOCUMENTS

| | | | |
|---|---|---|---|
| 5,321,661 | 6/1994 | Iwakiri et al. | 365/222 |
| 5,349,562 | 9/1994 | Tamizaki | 365/222 |
| 5,450,364 | 9/1995 | Stephens, Jr. et al. | 365/222 |

FOREIGN PATENT DOCUMENTS 62-154291  7/1987  Japan .

Primary Examiner—David C. Nelms
Assistant Examiner—Vu A. Le
Attorney, Agent, or Firm—Sughrue, Mion, Zinn, Macpeak & Seas

[57] ABSTRACT

A semiconductor memory device includes a memory cell array including a plurality of memory cells arranged in column and row directions in a matrix manner, and an oscillating section for oscillating in response to a self-refresh operation mode to generate an oscillation signal. A timer signal generating section outputs, as a timer signal based on the oscillation signal from the oscillating section, a first clock signal in a normal operation mode and a second clock signal in a test operation mode, the second clock signal being longer than the first clock signal and associated with a maximum usable temperature of the semiconductor memory device. An address signal generating section sets the self-refresh operation mode in response to an inputted control signal, sequentially generates row address signals to, the memory cell array for self-refresh operation in response to the timer signal from the timer signal generating section, and resets the self-refresh operation mode when a predetermined time period has elapsed after the self-refresh operation mode is set. A determining section determines the validity of the refresh operation from data stored in the memory cell array before the refresh operation and data read out of the memory cell array during or after the refresh operation.

20 Claims, 9 Drawing Sheets

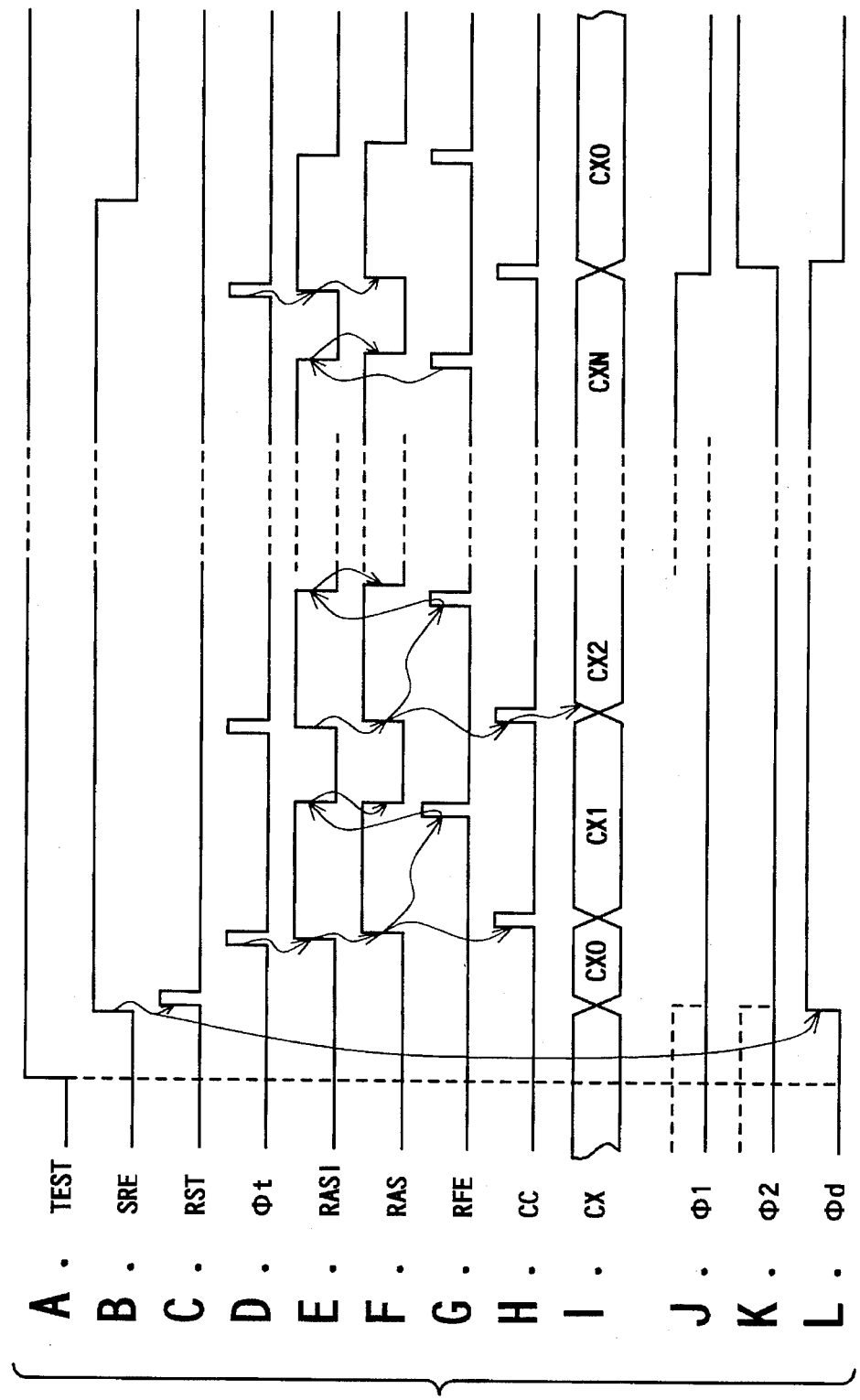

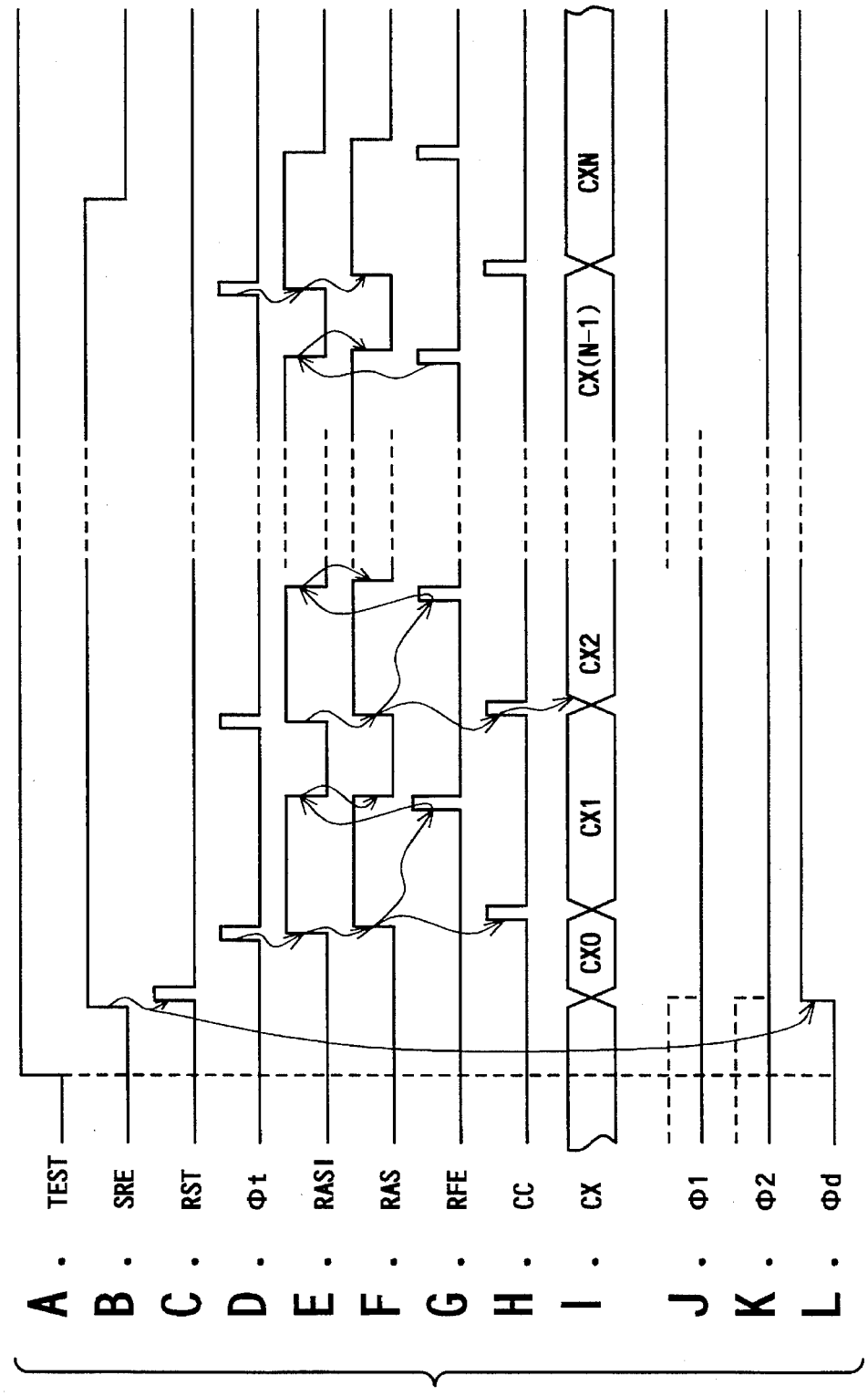

RELIABLE SELF-REFRESHING OPERATION IN A DRAM TYPE OF SEMICONDUCTOR MEMORY DEVICE

BACKGROUND OF THE INVENTION

1. Field of the Invention

The present invention relates to a dynamic random access memory (DRAM) type of semiconductor memory device, and more particularly to a reliable self-refreshing operation of a DRAM type of semiconductor memory device.

2. Description of Related Art

In a conventional DRAM type of semiconductor memory device, a data stored in a memory cell disappears because of discharge if a refresh operation is not executed for a long time. Therefore, it is necessary to execute a self-refreshing operation periodically before the stored data disappears. Typically, the DRAM type of semiconductor memory device enters the self-refreshing mode when a control signal satisfies a predetermined condition and automatically executes a self-refreshing operation. In this case, an internal row address signal and a timing signal for it are generated and the self-refreshing operation is continued while power is supplied to the semiconductor memory device.

FIG. 1 is a block diagram of a conventional self-refreshing circuit of a DRAM type of semiconductor memory device. Referring to FIG. 1, the conventional self-refreshing circuit includes a timer circuit 101x for generating a timer signal $\phi t$ from an oscillation signal internally generated in response to a self-refresh entry signal SRE inputted thereto, an oscillation frequency switching circuit 105 for switching the period of the timer signal $\phi t$, a self-refresh control circuit 102, a RAS control circuit 103 and an internal row address counter 104 connected to a memory cell array (not shown) including a plurality of memory cells arranged in column and row directions in a matrix manner. The timer circuit 101x includes a ring oscillator 111 oscillating in response to the self-refresh entry signal SRE to generate an internal reference clock signal ICK having a predetermined period of time, and a counter circuit 112 for counting or dividing the clock signal ICK to generate the timer signal $\phi t$ having a predetermined period of time. The oscillation frequency switching circuit 105 allows the frequency of clock signal ICK to be switched such that the clock signal ICK has a longer time period. The self-refresh control circuit 102 generates the self-refresh entry signal SRE in a high level in response to a self-refresh mode detecting signal SRED which becomes active when a predetermined self-refresh condition is satisfied, and generates an internal RAS signal RASI which becomes active (the high level) in synchronous with the timer signal $\phi t$ and becomes inactive in response to a refresh end signal RFE inputted thereto. The RAS control circuit 103 includes logic gates G104 and G105 and control signal generating circuit 131. The RAS control circuit 103 generates and outputs the refresh end signal RFE to the self-refresh control circuit 102 and a signal CC to the internal row address counter 104. More particularly, while the self-refresh entry signal SRE is active, a RAS signal RAS is generated in response to the falling down of an external RAS signal RASE in synchronous with the timer signal $\phi t$ by the logic gates G104 and G105 and then in response to the RAS signal RAS by the control signal generating circuit 131 a counter control signal CC is generated in synchronous with the rising of the RAS signal RAS and the refresh end signal RFE is generated after a predetermined time interval from when the counter control signal CC is generated. The internal row address counter 104 generates an internal row address signal CX (CX0, CX1, . . . , CXn) sequentially updated in synchronous with the counter control signal CC. Data stored in the plurality memory cells of the memory cell array is sequentially refreshed in accordance with the internal row address signal CX.

Next, the refresh operation of the conventional DRAM type of semiconductor device will be described below with reference to FIGS. 2A to 2G.

First, when it is informed by a control signal that a condition for the self-refresh mode is satisfied, the self-refresh mode detection signal SRED is made active. The self-refresh control circuit 102 sets the self-refresh entry signal SRE in an active state (a high level) in response to the transition of the self-refresh mode detection signal SRED to the active state to enter the self-refresh mode, as shown in FIG. 2A.

In response to the active self-refresh entry signal SRE, the ring oscillator 111 starts oscillation to generate the oscillation signal as an internal reference clock signal ICK having a predetermined time period and supplies the signal ICK to the counter circuit 112. The counter circuit 112 counts or divides the internal reference clock signal ICK in such a manner that the timer signal $\phi t$ is generated to have a period of time integral times longer than that of the signal ICK, as shown in FIG. 2B. The timer signal $\phi t$ is supplied to the self-refresh control circuit 102.

The self-refresh control circuit 102 makes the internal RAS signal RASI active in synchronous with the timer signal $\phi t$, as shown in FIG. 2C and the signal RASI is supplied to the RAS control circuit 103. At this time, in the RAS control circuit 3, since the self-refresh entry signal SRE is in the active level, the internal RAS signal RASI is passed through to the RAS control signal generating circuit 131 as the RAS signal RAS when the external RAS signal RASE is made active (a low level), as shown in FIG. 2D. The generating circuit 131 generates the counter control signal CC in synchronous with the rising of the RAS signal RAS as shown in FIG. 2F and the signal CC is supplied to the internal row address counter 104. The internal row address counter 104 generates the internal row address signal CX in response to the counter control signal CC to update the row address as shown in FIG. 2G. As a result, the refresh operation is performed to the row of the memory cell array having the row address outputted from the internal row address counter 104. At the timing when the refresh operation to the row is completed, the RAS control signal generating circuit 131 generates the refresh end signal RFE and supplies to the self-refresh control circuit 102 as shown in FIG. 2E. The self-refresh control circuit 102 makes the internal RAS signal RASI inactive in response to the refresh end signal RFE.

Thereafter, the next timer signal $\phi t$ is inputted to the self-refresh control circuit 102 and the above-mentioned operation is repeated. In this manner, the memory cell array can be refreshed in units of rows by repeatedly supplying the timer signal $\phi t$.

On the other hand, since data holding time of each of the memory cells of the memory cell array changes greatly depending upon the ambient temperature, the ambient temperature change greatly affects the period of time of the refresh operation. FIG. 3 shows a relation of the data holding time and the temperature. In FIG. 3, the ordinate indicates a logarithmic data holding time and the abscissa indicates the ambient temperature. As seen from the figure, the logarithmic data holding time is linearly and reversely proportional to the ambient temperature. Since a usable temperature region is regulated in a region of temperature $T_L$ to temperature $T_H$ in the semiconductor memory device such as a dynamic RAM, the period of the timer signal φt (to be referred to as a timer period hereinafter) is set in such a manner that the refresh operation can be normally performed in the usable temperature region. More particularly, since the allowable timer period is tab at the maximum usable temperature where the data holding time is the shortest, the timer period φt needs to be set to tab or shorter. Further, since the data holding time has one of dispersed values, the timer period φt needs to be set to $t_{dh}$ or shorter, taking the worst case into account. Even if a manufacturer intends to guarantee the self-refresh operation, since the timer period φt does not almost have the temperature dependency, the wafer test process at the room temperature $T_A$ cannot guarantee the self-refresh operation at the maximum usable temperature $T_H$. Therefore, the data holding time $t_{da}$ at the room temperature $T_A$ is guaranteed in correspondence to the data holding time $t_{dh}$ at the maximum usable temperature $T_H$.

With the consumed current, current in the self-refresh operation (IccSR) is reversely proportional to the timer period, i.e., refresh period. That is, the longer timer period is advantageous from the viewpoint of the consumed current. On the contrary, the longer timer period is severe in the data holding time and has the possibility of data holding fault. For this reason, recently, the products of semiconductor memory device is classified depending upon the timer period. That is, a semiconductor memory device having a longer data holding time is used in a longer timer period and a semiconductor memory device having a shorter data holding time used in a shorter timer period.

SUMMARY OF THE INVENTION

The present invention is made in the light of circumstances mentioned above and has, as an object, to provide a method of determining, at a room temperature, whether or not a timer period is valid at the maximum usable temperature in a self-refresh mode and a semiconductor memory device for the method.

Another object of the present invention is to provide a method of allowing a timer period to be adjusted so that the product yield is increased and a semiconductor memory device for the method.

In order to achieve an aspect of the present invention, a semiconductor memory device includes a memory cell array including a plurality of memory cells arranged in column and row directions in a matrix manner, an oscillating section for oscillating in response to a self-refresh operation mode to generate an oscillation signal, a timer signal generating section for outputting, as a timer signal based on the oscillation signal from the oscillating section, a first clock signal in a normal operation mode and a second clock signal in a test operation mode, the second clock signal being longer than the first clock signal and associated with a maximum usable temperature of the semiconductor memory device, and an address signal generating section for setting the self-refresh operation mode in response to an inputted control signal, for sequentially generating row address signals to the memory cell array for self-refresh operation in response to the timer signal from the timer signal generating section, and for resetting the self-refresh operation mode when a predetermined time period has elapsed after the self-refresh operation mode is set.

The second clock signal is longer than the first clock signal in proportional to a ratio of the data holding time of the memory cell array at the room temperature to that of the memory cell array at the maximum usable temperature of the semiconductor memory device, so that the refresh operation at the maximum usable temperature can be estimated at a room temperature. The generating section may include a first generating circuit for generating the first clock signal from the oscillation signal from the oscillating section, a second generating circuit for generating the second clock signal from the oscillation signal from the oscillating section, and a selecting section for outputting the first clock signal as the timer signal in the normal operation mode and inhibiting the first clock signal from being output in the test operation mode to output the second clock signal as the timer signal. In this case, the test operation mode may be externally set.

The semiconductor memory device may further include a timer period determining section for determining whether a time period of the timer signal is valid. Thereby, the normal timer signal can be estimated. In this case, the address signal generating section resets the self-refresh operation mode after a refresh time interval estimated to be required to perform the refresh operation to all the memory cells in the memory cell array predetermined times from the start of the refresh operation, and the timer period determining section detects the number of times by which the refresh operation is performed to all the memory cells during the refresh time interval. The determining result may be outputted to allow the oscillating section to be adjusted such that the first clock signal has a shorter period than the original period.

In order to achieve another aspect of the present invention, a method of determining at a room temperature the validity of a refresh operation at maximum usable temperature in a semiconductor memory device, the method comprising the steps of:

generating in a test mode, a test timer signal having a time period obtained by multiplying a predetermined period by a ratio of a data holding time of a memory cell array at the room temperature to that of the memory cell array at the maximum usable temperature;

performing a refresh operation to a memory cell array using the test timer signal; and determining the validity of the refresh operation from data stored in the memory cell array before the refresh operation and data read out of the memory cell array during or after the refresh operation.

BRIEF DESCRIPTION OF THE DRAWINGS

FIGS. 8A through 8L are timing charts of various signals in the semiconductor memory device according to the second embodiment when the timer period is valid; and FIGS. 9A through 9L are timing charts of various signals in the semiconductor memory device according to the second embodiment when the timer period is invalid.

DESCRIPTION OF THE PREFERRED EMBODIMENTS

The semiconductor memory device according to the present invention will be described below in detail with reference to the accompanying drawings.

Figure 4:
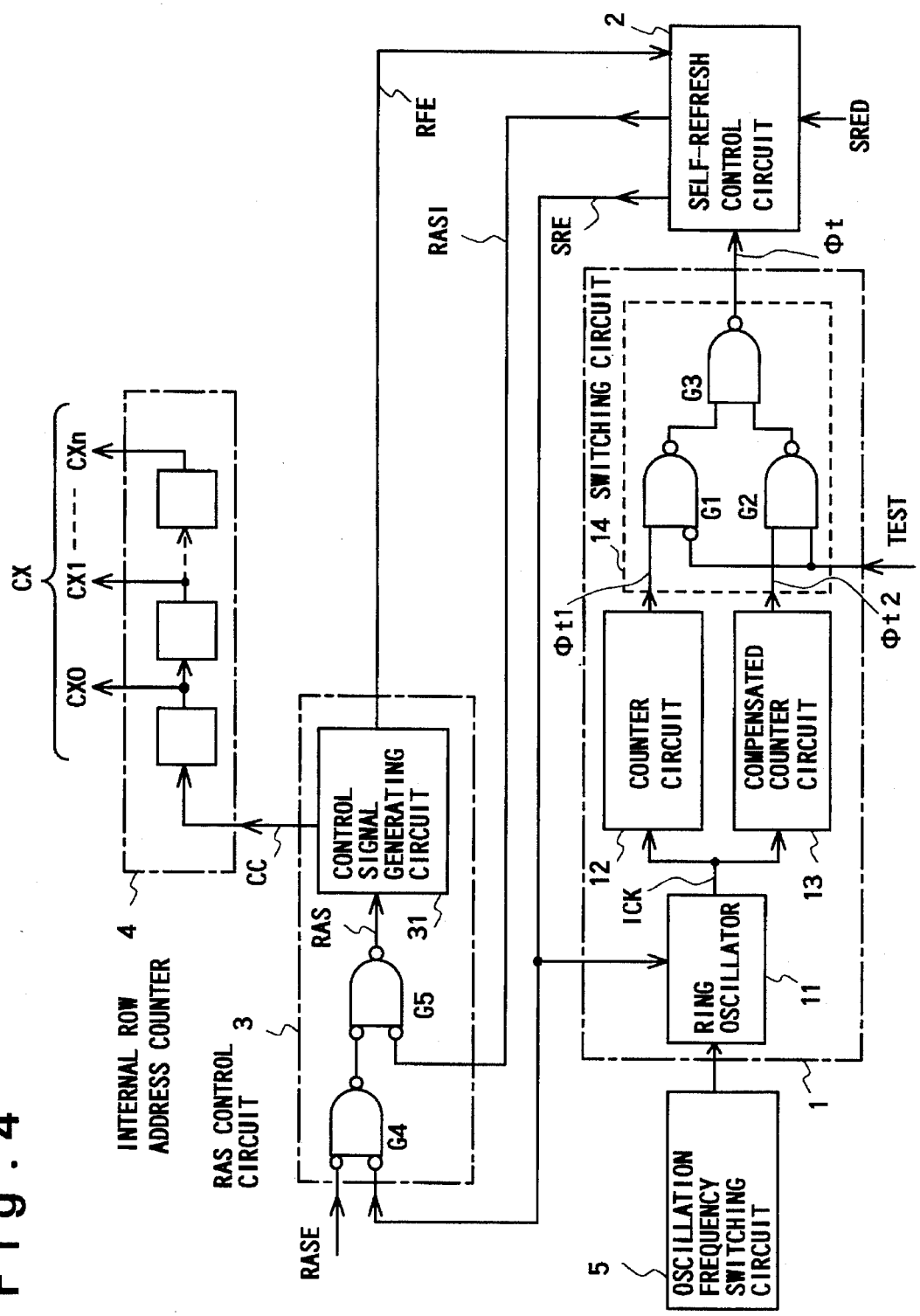
FIG. 4 is a block diagram of a semiconductor memory device according to a first embodiment of the present invention.

FIG. 4 is a block diagram of a self-refreshing circuit of a DRAM type of semiconductor memory device according to an embodiment of the present invention. Referring to FIG. 4, the self-refreshing circuit includes a timer circuit 1 for generating a timer signal $\phi t$ from an oscillation signal internally generated in response to a self-refresh entry signal SRE inputted thereto, an oscillation frequency switching circuit 5 for switching the period of the timer signal $\phi t$, a self-refresh control circuit 2, a RAS control circuit 3 and an internal row address counter 4 connected to a memory cell array (not shown) including a plurality of memory cells arranged in column and row directions in a matrix manner.

The timer circuit 1 includes a ring oscillator 11 oscillating in response to the self-refresh entry signal SRE to generate an internal reference clock signal ICK having a predetermined period of time, a first counter circuit 12 for counting or dividing the clock signal ICK to generate the timer signal $\phi t1$ having a first predetermined period of time, a second compensated counter circuit 13 for counting or dividing the clock signal ICK to generate the timer signal $\phi t 2$ having a second predetermined period of time which is longer than the first predetermined period of time, and a switching circuit t4 for outputting one of the timer signals $\phi t1$ and $\phi t2$ as the $\phi$timer signal $\phi t$ in accordance with a signal TEST. The timer signal $\phi t1$ is used in a normal self-refresh operation and the timer signal $\phi t2$ is used in a test self-refresh operation. The compensated counter circuit 13 generates the timer signal $\phi t2$ such that the relation between the timer period and the data holding time at the room temperature corresponds to the relation between the timer period and the data holding time at the maximum usable temperature. The switching circuit 14 includes a three NAND gates G1, G2 and G3. The timer signals $\phi t1$ and $\phi t2$ are supplied to one of the two inputs of the logic gates G1 and G2, respectively, and the signal TEST which is made active in a test mode is supplied to the other inverted input of the logic gate G1 and the other non-inverted input of the logic gate G2. The inverted outputs of the logic gates G1 and G2 are supplied to the NAND logic gate G3 which outputs the timer signal $\phi t$ to the self-refresh control circuit 2. The oscillation frequency switching circuit 105 allows the frequency of clock signal ICK to be switched such that the clock signal ICK has a longer time period.

The self-refresh control circuit 2 generates the self-refresh entry signal SRE in a high level in response to a self-refresh mode detecting signal SRED which becomes active when a predetermined self-refresh condition is satisfied, and generates an internal RAS signal RASI which becomes active (the high level) in synchronous with the timer signal $\phi t$ and becomes inactive in response to a refresh end signal RFE inputted thereto. The RAS control circuit 3 includes NAND logic gates G4 and G5 and control signal generating circuit 31. The logic gate G4 receives an external RAS signal RASE of active low at one of two inverted inputs and the self-refresh entry signal SRE at the other inverted input. The logic gate G5 receives the output of the logic gate G4 at one of two inverted inputs and the internal RAS signal RAS1 the other inverted input. The RAS control circuit 3 generates and outputs the refresh end signal RFE to the self-refresh Control circuit 2 and a signal CC to the internal row address counter 4. More particularly, while the self-refresh entry signal SRE is active, a RAS signal RAS is generated in response to the falling down of an external RAS signal RASE in synchronous with the timer signal $\phi t$ by the logic gates G4 and G5 and then in response to the RAS signal RAS by the control signal generating circuit 31 the counter control signal CC is generated in synchronous with the rising of the RAS signal RAS and the refresh end signal RFE is generated after a predetermined time interval from when the counter control signal CC is generated. The internal row address counter generates an internal row address signal CX (CX0, CX1, ..., CXn) sequentially updated in synchronous with the counter control signal CC. Data stored in the plurality memory cells of the memory cell array is sequentially refreshed in accordance with the internal row address signal CX.

Next, the refresh operation of the DRAM type of semiconductor device according to the first embodiment of the present invention will be described below with reference to FIGS. 5A to 5G.

First, when it is informed by a control signal that a condition for the self-refresh mode is satisfied, the self-refresh mode detection signal SRED is made active. The self-refresh control circuit 2 sets the self-refresh entry signal SRE in an active state (a high level) in response to the transition of the self-refresh mode detection signal SRED to the active state to enter the self-refresh mode, as shown in FIG. 5A.

In response to the active self-refresh entry signal SRE, the ring oscillator 11 starts oscillation to generate the oscillation signal as an internal reference clock signal ICK having a predetermined time period and supplies the signal ICK to the counter circuit 12 and the compensated counter circuit 13. The counter circuit 12 counts or divides the internal reference clock signal ICK in such a manner that the timer signal $\phi t1$ is generated to have a period of time integral times longer than that of the signal ICK and the compensated counter circuit 13 counts or divides the internal reference clock signal ICK in such a manner that the timer signal $\phi t2$ is generated to have a period of time proportional to the ratio between the data holding time at the maximum usable temperature of the semiconductor memory device and the allowable timer period with respect to the data holding time at the room temperature. That is, referring to FIG. 6, when the data holding time and the timer period are $t_{ah}$ and $t_{bh}$ at the maximum usable temperature $T_H$, respectively and the data holding time is $t_{aa}$ at the room temperature $T_A$, the timer signal $\phi t2$ has a period of time equal to $(t_{bh}/t_{ah}) \times t_{aa}$. Thus, the timer period B in FIG. 6 can be shifted to the timer period b' (the data holding time is shifted from A to A'). As a result, the refresh operation at the maximum usable temperature can be simulated at the room temperature by using the data holding time $t_{aa}$ and the timer period $(t_{bh}/t_{ah}) \times t_{aa}$. The timer signals $\phi t1$ and $\phi t2$ are supplied to the logic gates G1 and G2. Since the signal TEST is active (in the high level) in a test mode, the timer signal $\phi t2$ is supplied to the self-refresh control circuit 2 as the timer signal $\phi t$ as shown in FIG. 5B. Note that since the signal TEST is in the low level in the normal self-refresh mode, the timer signal φt1 is selected to be supplied to the self-refresh control circuit 2.

Figure 5:
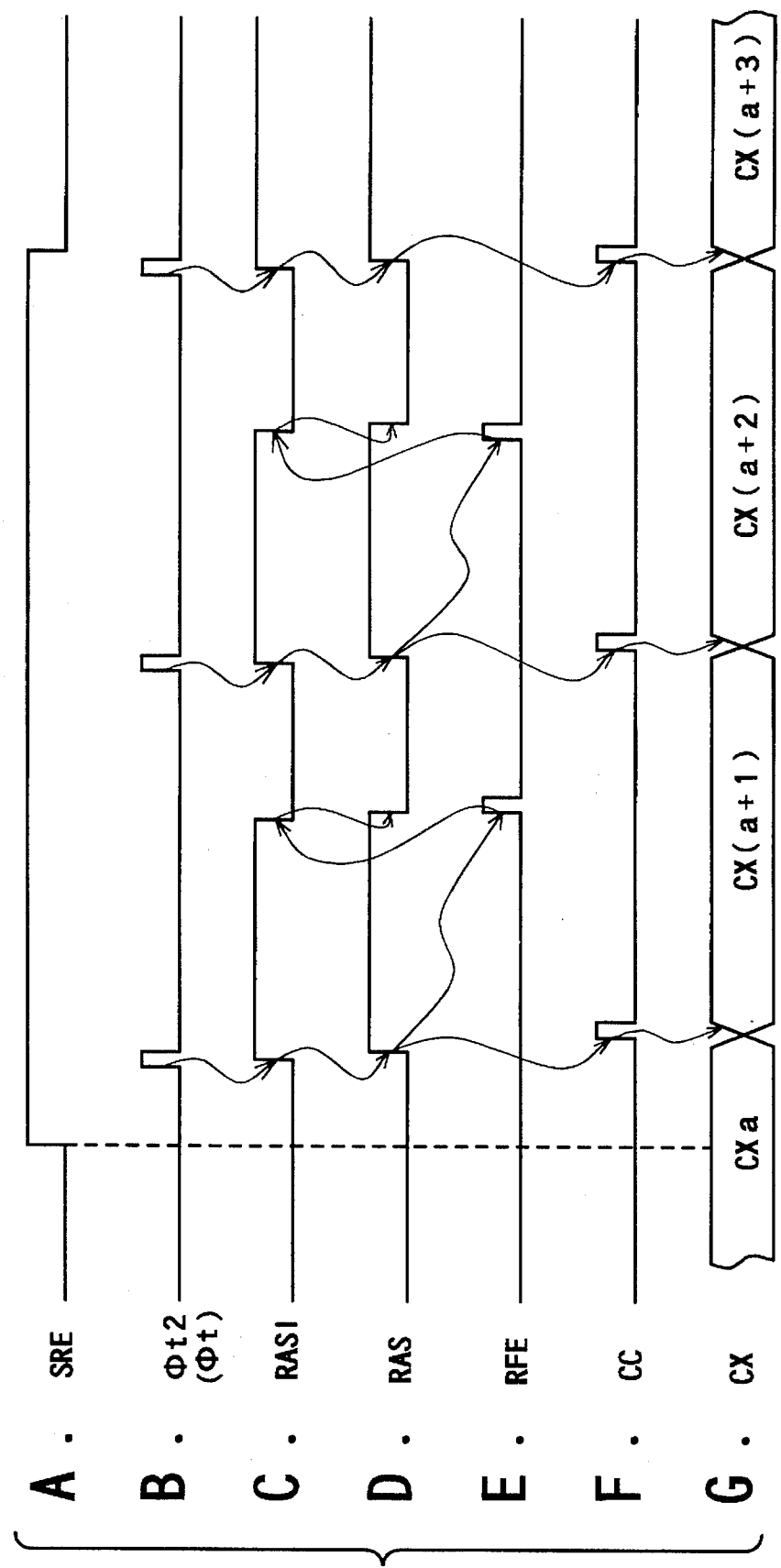
FIGS. 5A through 5G are timing charts of various signals in the semiconductor memory device according to the first embodiment.

The self-refresh control circuit 2 makes the internal RAS signal RASI active in synchronous with the timer signal φt, as shown in FIG. 5C and the signal RASI is supplied to the RAS control circuit 3. At this time, in the RAS control circuit 3, since the self-refresh entry signal SRE is in the active level, the internal RAS signal RASI is passed through to the RAS control signal generating circuit 31 as the RAS signal RAS when the external RAS signal RASE is made active (a low level), as shown in FIG. 5D. The generating circuit 31 generates the counter control signal CC in synchronous with the rising of the RAS signal RAS as shown in FIG. 5F and the signal CC is supplied to the internal row address counter 4. The internal row address counter 4 generates the internal row address signal CX in response to the counter control signal CC to update the row address as shown in FIG. 5G. As a result, the refresh operation is performed to the row of the memory cell array having the row address outputted from the internal row address counter 4. At the timing when the refresh operation to the row is completed, the RAS control signal generating circuit 31 generates the refresh end signal RFE and supplies to the self-refresh control circuit 2 as shown in FIG. 5E. The self-refresh control circuit 2 makes the internal RAS signal RASI inactive in response to the refresh end signal RFE.

Thereafter, the next timer signal φt is inputted to the self-refresh Control circuit 2 again and the abovementioned operation is repeated. In this manner, the memory cell array can be refreshed in units of rows by repeatedly supplying the timer signal φt. In this case, if data is stored in the memory cells prior to the self-refresh operation and the data is compared with the data read out from the memory cells, it can be determined whether the timer signal is valid.

Figure 1:
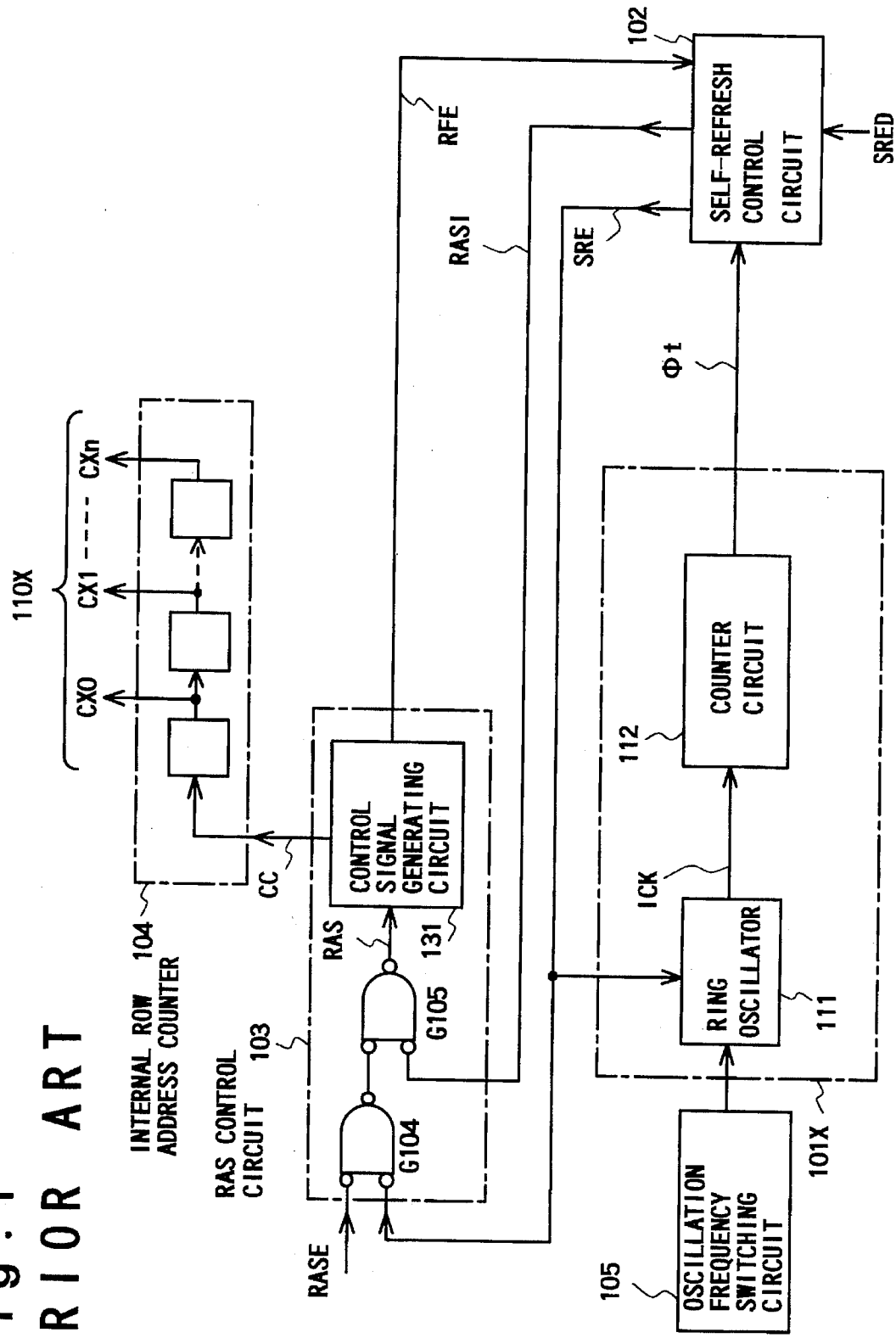
FIG. 1 is a block diagram of a conventional semiconductor memory device.
Figure 2:
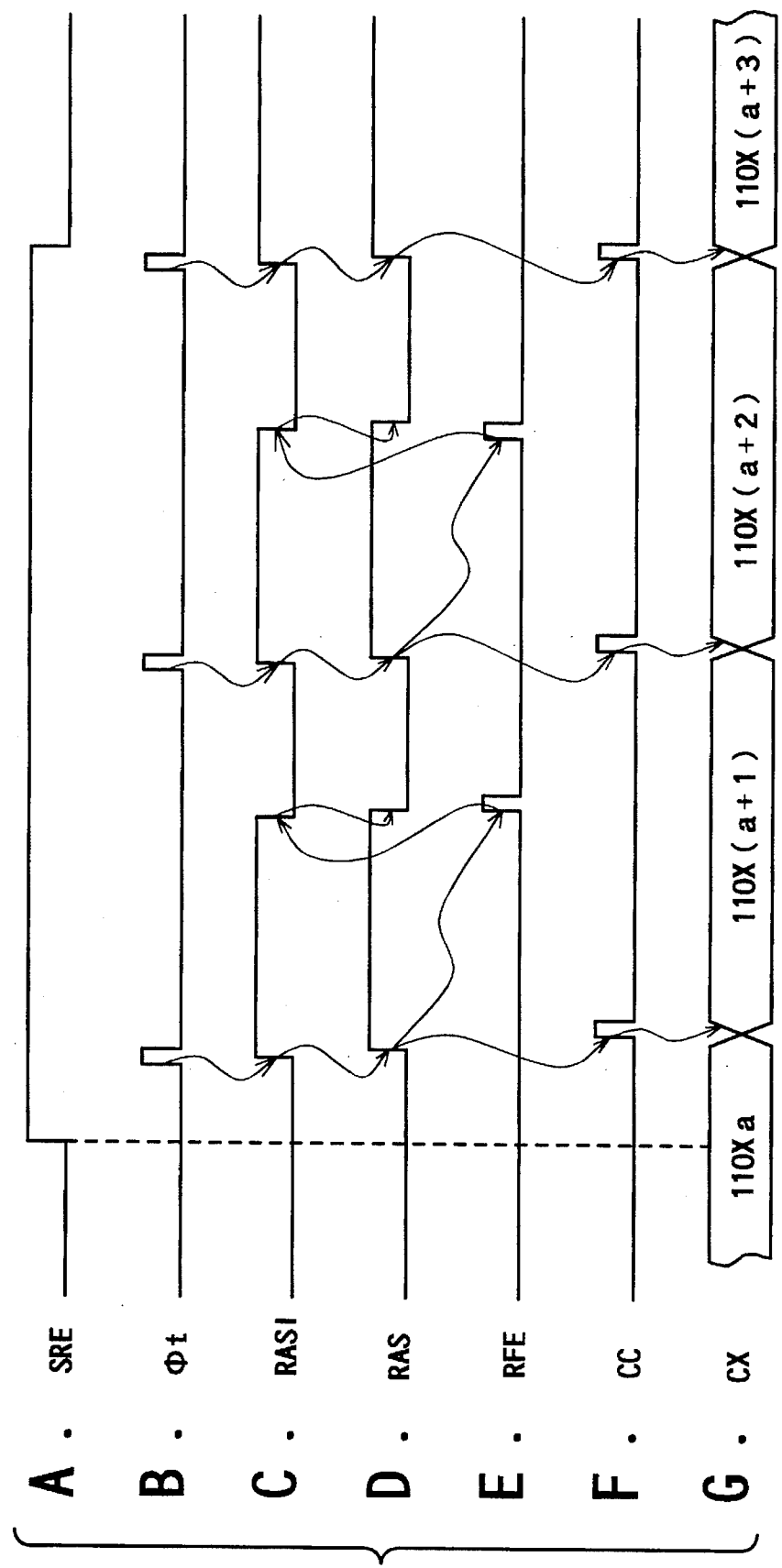
FIGS. 2A through 2G are timing charts of various signals in the conventional semiconductor memory device shown in FIG. 1.
Figure 3:
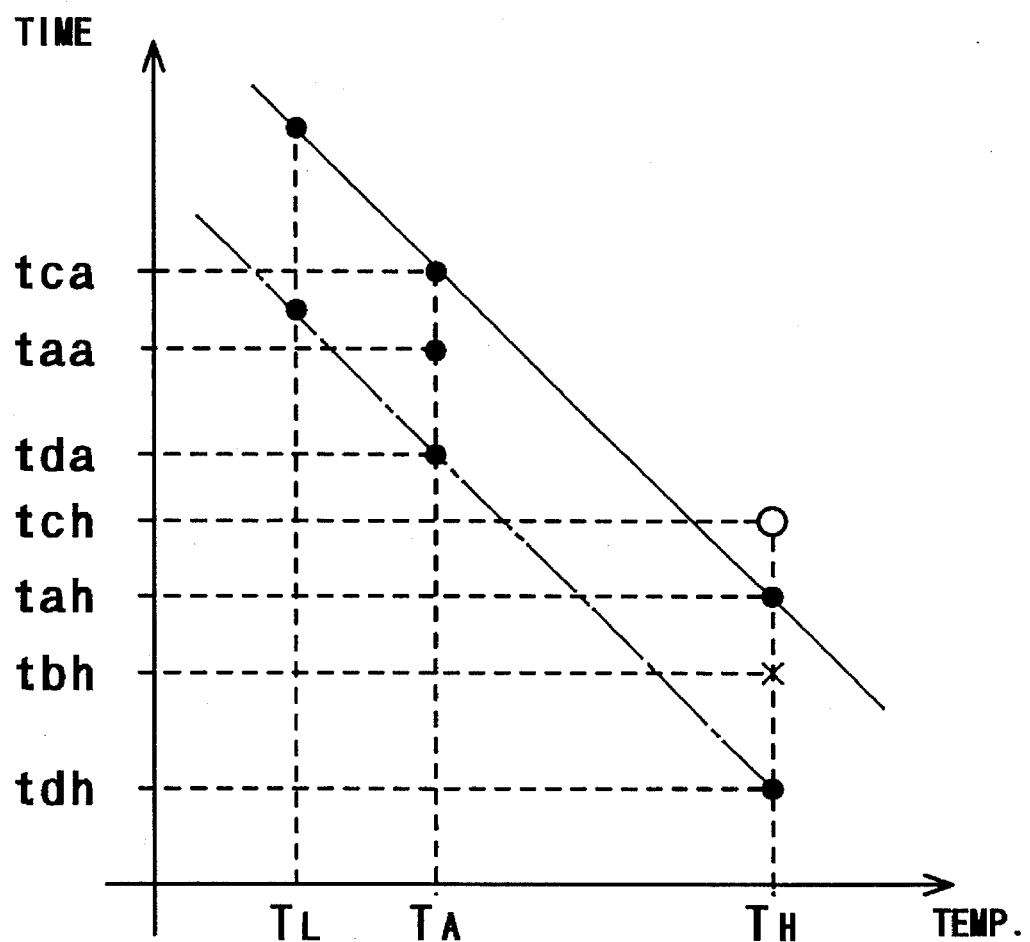
FIG. 3 is a diagram showing a relation between data holding time and temperature in the conventional semiconductor memory device shown in FIG. 1.
Figure 6:
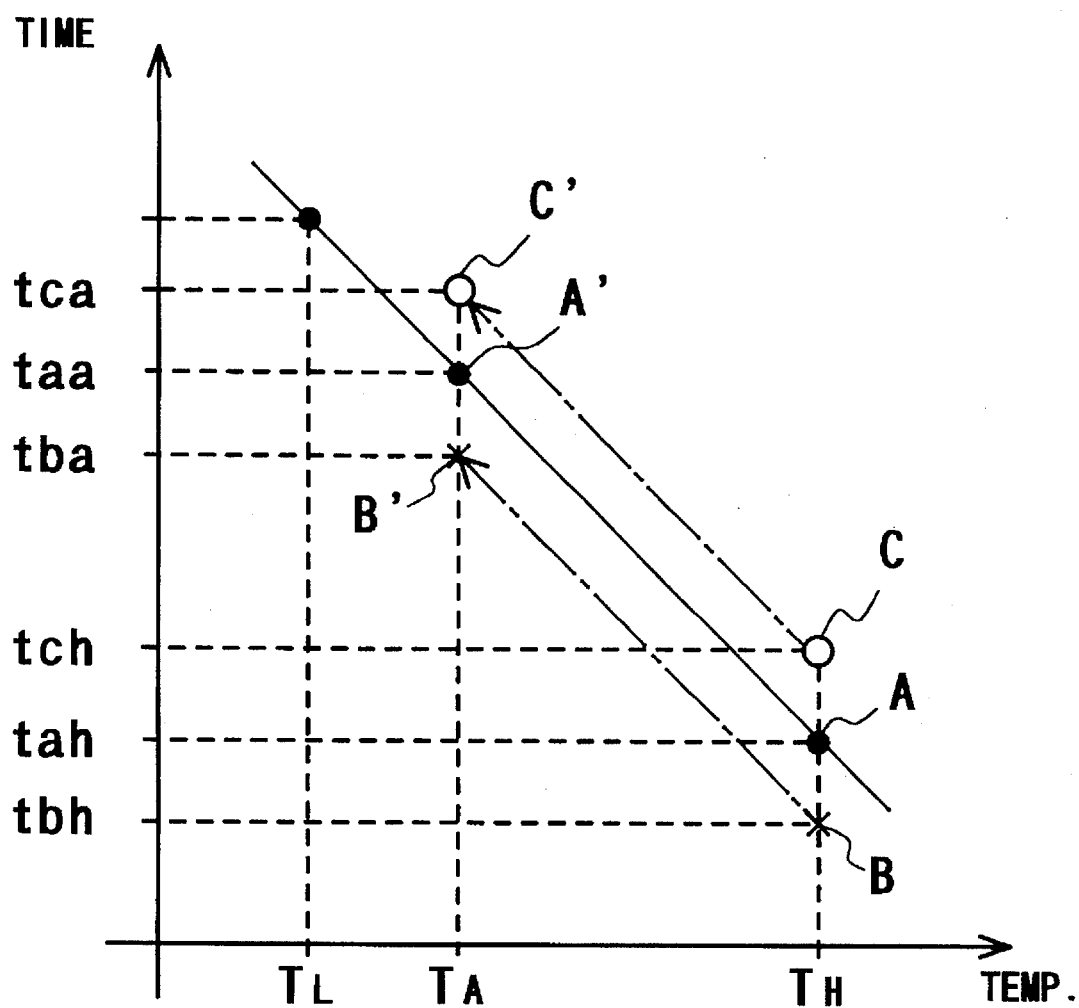
FIG. 6 is a diagram showing a relation between data holding time and temperature in the semiconductor memory device shown in FIG. 4.
Figure 7:
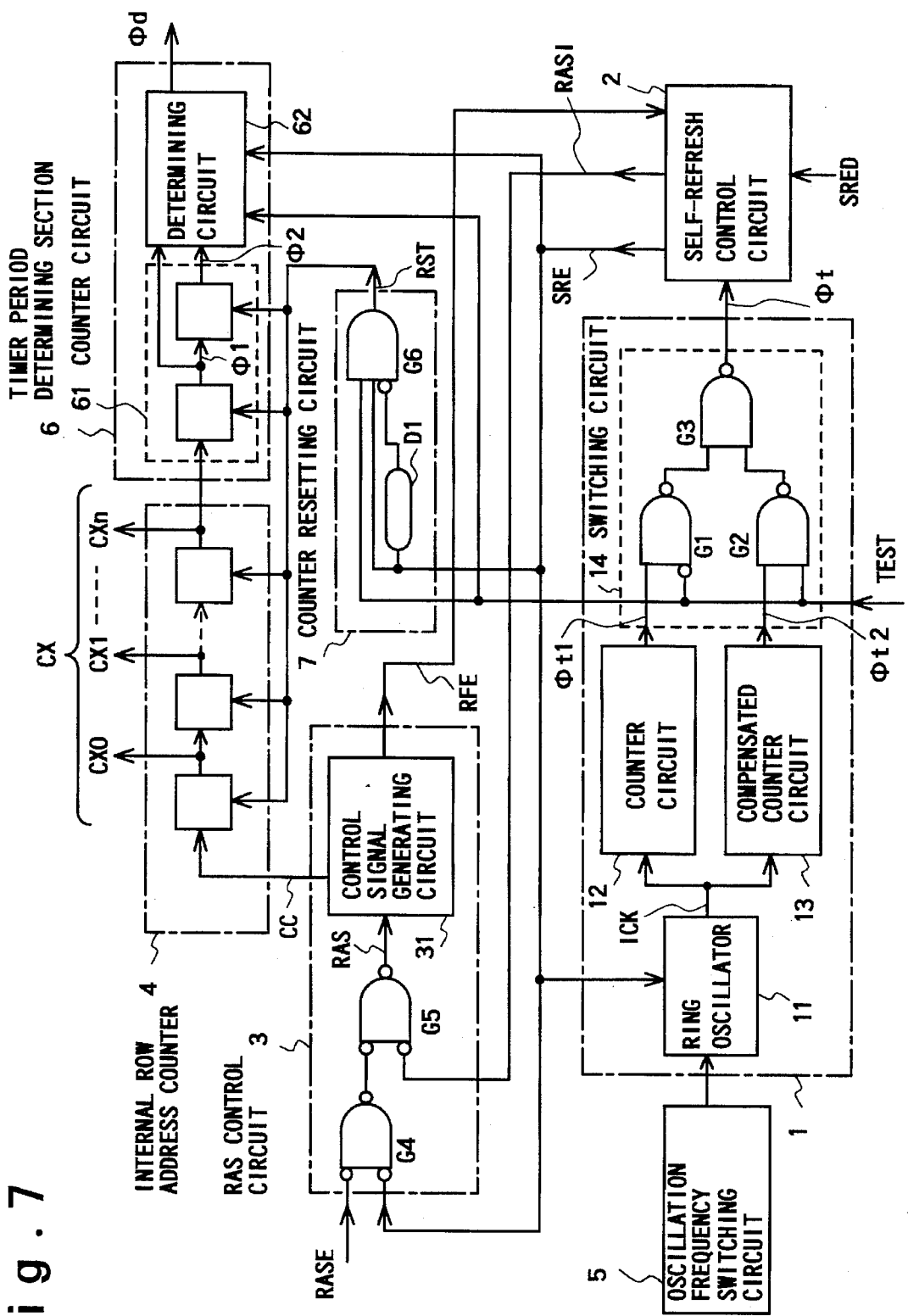
FIG. 7 is a block diagram of a semiconductor memory device according to a second embodiment of the present invention.

As described above, the present embodiment is different from the conventional semiconductor memory device shown in FIG. 1 in that the compensated counter circuit 13 and the switching circuit 14 composed of the logic gates G1 to G3 are added in the timer circuit 1. As a result, the period of the timer signal φt can be elongated or shortened with the same temperature coefficient as that of the data holding time required for the memory cell array in a test mode, i.e., when the test signal TEST is made active, as shown in FIG. 6. Accordingly, whether the timer period is valid and whether the data holding fault is generated can be checked at the room temperature. In this manner, the data holding time fault can be reliably ridded. Note that the change amount of the timer period relative to that of the timer signal φt1 in the compensated counter circuit 13 is determined in test production and set in a mask level. Therefore, the change amount is fixed. However, the change amount may be adjusted using fusing of a pattern.

In the semiconductor memory device which has a data holding time out Of the specification, if the oscillation frequency is made high, i.e., the period of oscillation signal is made short by the oscillation frequency switching circuit 5, the data holding time fault can be ridded. That is, all the products can be satisfy the specification.

Next, a semiconductor memory device according to the second embodiment will be described below. In this embodiment, the many portions are the same as in those shown in FIG. 4. Therefore, only the different points will be described. In this embodiment, a timer period determining section 6 and a counter resetting circuit 7 are added to the semiconductor memory device of the first embodiment.

The timer period determining section 6 includes a counter circuit 6i and a determining circuit 62. The counter circuit 61 counts the most significant bit (MSB) of the row address updated by the internal row address counter 4 to output signals φ1 and φ2. The determining circuit 62 receives the self-refresh entry signal SRE which is active during a time interval which is required to perform the refresh operation twice to all the memory cells of the memory cell array, the test signal TEST and the signals φ1 and φ2 and determines that the semiconductor memory device is not defective in the timer period and outputs a signal φd, if the internal row address signal CX is updated twice while the self-refresh entry signal SRE is active.

The counter resetting circuit 7 includes a delay element D1 and a logic gate G6. The logic gate G6 receives the signal TEST, the self-refresh entry signal SRE and the delayed signal by the delay element D1 and resets the internal address Counter 4 and the counter circuit 61 in synchronous with the self-refresh entry signal SRE.

Next, the operation of the semiconductor memory device according to the second embodiment will be described with reference to FIGS. 8A to 8L and 9A to 9L. The signals SRE, φt, RASI, RAS and RFE are the same as in the first embodiment. Therefore, the description of these signals will be omitted.

If the test signal TEST is made active as shown in FIGS. 8A and 9A and the self-refresh entry signal SRE is made active as shown in FIGS. 8B and 9B, the reset signal RST is generated as shown in FIGS. 8C and 9C to supplied to the internal row address counter 4 and the counter circuit 61 which are reset or initialized. At the same time, the determination signal φd is set to the high level as shown in FIGS. 8L and 9L. As shown in FIGS. 8I and 9I, the internal row address signal CX is sequentially updated in response to the counter control signal CC of FIGS. 8H and 9H and the memory cells of the memory cell array are sequentially refreshed in units of rows. Since the MSB CXn of the internal row address signal CX changes when all the memory cells in the memory cell array are completely refreshed, the change is counted by the counter circuit 61 as shown in FIGS. 8J, 8K, 9J and 9K. The output φ1 of the counter circuit 61 changes at the first and second cycles of the refresh operation to the all the memory cells and the output φ2 of the counter circuit 61 changes at the second cycle in response to the change of output φ1.

Therefore, if the output signals φ1 and φ2 both change during the time interval during which the self-refresh entry signal SRE is active, it indicates that the self-refresh operation is performed twice to all the memory cells in the memory cell array. Accordingly, the determination signal φd is made low to indicate that the timer period is valid as shown in FIG. 8L. If the timer period it too long, since the refresh operation does not reach the last internal row address as shown in FIG. 9I when the self-refresh entry signal SRE is made inactive, the output signal φ2 does not change so that the determination signal φd is kept in the high level as shown in FIG. 9L. In this case, the oscillation frequency switching circuit 5 is used to change the frequency of the oscillation signal of the ring oscillator into a higher level to shorten the timer period. In this manner, the validity of the timer period can be checked at the room temperature and the timer period fault can be reduced.

Note that the oscillation frequency switching circuit is adjusted in the mask level as in the compensated counter circuit 13. However, the fusing a pattern may be employed. Alternatively, the counter circuit 12 may be adjusted instead of adjusting the oscillation frequency. In this case, an additional counter may be added to the counter circuit 12 so that the signal φ1 can be output when the more oscillation signal are counted.

Further, the duration during which the self-refresh entry signal SRE is active is not limited to the two cycles of the refresh operation. The duration may be arbitrarily set using the self-refresh mode detection signal SRED.

In addition, if a programmable element is used for the oscillation frequency switching circuit 5, the timer period may be adjusted by use of the determination signal φd.

Alternatively, various modification could be considered by the person skilled in the art.

What is claimed is:

1. A semiconductor memory device comprising:

a memory cell array including a plurality of memory cells arranged in column and row directions in a matrix manner;

oscillating means for oscillating in response to a self-refresh operation mode to generate an oscillation signal;

timer signal generating means for outputting, as a timer signal based on said oscillation signal from said oscillating means, a first clock signal in a normal operation mode and a second clock signal in a test operation mode, said second clock signal being longer than said first clock signal and associated with a maximum usable temperature of said semiconductor memory device; and address signal generating means for setting the self-refresh operation mode in response to an inputted control signal, for sequentially generating row address signals to said memory cell array for self-refresh operation in response to said timer signal from said timer signal generating means, and for resetting the self-refresh operation mode when a predetermined time period has elapsed after the self-refresh operation mode is set.

2. A semiconductor memory device according to claim 1, wherein said second clock signal is longer than said first clock signal in proportional to a ratio of the data holding time of the memory cell array at the room temperature to that of the memory cell array at the maximum usable temperature of said semiconductor memory device.

3. A semiconductor memory device according to claim 1, wherein said generating means includes:

a first generating circuit for generating said first clock signal from said oscillation signal from said oscillating means;

a second generating circuit for generating said second clock signal from said oscillation signal from said oscillating means; and selecting means for outputting said first clock signal as said timer signal in the normal operation mode and inhibiting said first clock signal from being output in the test operation mode to output said second clock signal as said timer signal.

4. A semiconductor memory device according to claim 3, wherein the test operation mode is externally set.

5. A semiconductor memory device according to claim 1, wherein said address signal generating means resets the self-refresh operation mode when the refresh operation is performed to all the memory cell in the memory cell array once.

6. A semiconductor memory device according to claim 1, further comprising adjusting means for adjusting said oscillating means such that said first clock signal has a shorter period than the original period.

7. A semiconductor memory device according to claim 1, further comprising timer period determining means for determining whether a time period of said timer signal is valid.

8. A semiconductor memory device according to claim 7 wherein said address signal generating means resets the self-refresh operation mode after a refresh time interval estimated to be required to perform the refresh operation to all the memory cells in the memory cell array predetermined times from the start of the refresh operation, and wherein said timer period determining means detects the number of times by which the refresh operation is performed to all the memory cells during the refresh time interval.

9. A semiconductor memory device according to claim 8, wherein said timer period determining means further comprising means for outputting a signal indicative of validity of the timer period when the refresh operation is performed to all the memory cells during the refresh time interval the predetermined time or more.

10. A semiconductor memory device according to claim 7, further comprising adjusting means for adjusting said oscillating means such that said first clock signal has a shorter period than the original period.

11. A method of determining at a room temperature the validity of a refresh operation at maximum usable temperature in a semiconductor memory device, said method comprising the steps of:

generating in a test mode, a test timer signal having a time period obtained by multiplying a predetermined period by a ratio of a data holding time of a memory cell array at the room temperature to that of the memory cell array at the maximum usable temperature;

performing a refresh operation to a memory cell array using said test timer signal; and determining the validity of the refresh operation from data stored in the memory cell array before the refresh operation and data read out of the memory cell array during or after the refresh operation.

12. A method according to claim 11, further comprising the step of generating a normal timer signal having the predetermined period and used for the refresh operation in a normal operation state.

13. A method according to claim 12, further comprising the step of determining validity of said normal timer signal.

14. A method according to claim 13, wherein said step of determining validity of said normal timer signal comprises the steps of:

setting a predetermined time interval;

repeatedly performing the refresh operation to the memory cell array during the predetermined time interval using said test timer signal; and determining the validity of said normal timer signal from the number of times of the refresh operation corresponding to the predetermined time interval and the number of times of the refresh operation actually performed.

15. A method according to claim 13, further comprising the step of adjusting to shorten the period of said normal timer signal when it is determined that said normal timer signal is not valid.

16. A semiconductor memory device comprising:

generating means for generating in a test mode a test timer signal such φthat a ratio of a time period of said test timer signal to that of a normal timer signal substantially equal to a ration of a data holding time of a memory cell array at a first temperature to that of the memory cell array at a second temperature which is different from the first temperature;

refresh means for performing a refresh operation to the memory cell array using said test timer signal; and refresh operation determining means for determining validity of the refresh operation from data stored in the memory cell array before the refresh operation and data read out of the memory cell array during or after the refresh operation.

17. A semiconductor memory device according to claim 16, wherein said refresh means performs the refresh operation to the memory cell array using said normal timer signal in a normal operation mode.

18. A semiconductor memory device according to claim 17, further comprising timer signal determining means for determining validity of said normal timer signal.

19. A semiconductor memory device according to claim 17, wherein said timer signal determining means comprises:

setting means for setting a predetermined time interval; and determining means for determining validity of said normal timer signal from the number of times of the refresh operation when there fresh operation is repeatedly performed by said refresh means during the predetermined time interval.

20. A semiconductor memory device according to claim 16, further comprising means for allowing the period of said normal timer signal to be shortened when it is determined that said normal timer signal is not valid.

* * * * *